(12) United States Patent
Shafer (10) Patent No.: US 7,573,655 B2
(45) Date of Patent: Aug. 11, 2009

(54) UNIT MAGNIFICATION PROJECTION OBJECTIVE

(75) Inventor: David Shafer, Fairfield, CT (US)

(73) Assignee: Carl Zeiss SMT AG, Oberkochen (DE)

( * ) Notice: Subject to any disclaimer, the term of this patent is extended or adjusted under 35 U.S.C. 154(b) by 92 days.

(21) Appl. No.: 11/870,025

(22) Filed: Oct. 10, 2007

(65) Prior Publication Data

US 2008/0117532 A1    May 22, 2008

Related U.S. Application Data

(60) Provisional application No. 60/851,053, filed on Oct. 12, 2006.

(30) Foreign Application Priority Data

Oct. 12, 2006    (EP) .................................. 06021401

(51) Int. Cl.
G02B 17/00 (2006.01)
G03B 27/52 (2006.01)
(52) U.S. Cl. ........................................ 359/727; 355/53
(58) Field of Classification Search .................. 353/53; 359/355, 649, 651, 726, 732, 733
See application file for complete search history.

(56) References Cited

U.S. PATENT DOCUMENTS 4,391,494 A * 7/1983 Hershel ...................... 359/727
5,031,977 A    7/1991 Gibson
5,559,629 A    9/1996 Sheets et al.
5,805,356 A *    9/1998 Chiba ......................... 359/727
6,813,098 B2    11/2004 Mercado
6,863,403 B2    3/2005 Mercado et al.
6,879,383 B2    4/2005 Mercado
7,148,953 B2 *    12/2006 Mercado ...................... 355/53
2006/0092395 A1    5/2006 Mercado

FOREIGN PATENT DOCUMENTS

EP    1912098 A1 *    4/2008
EP    1959289 A1 *    8/2008
WO    WO 01/77733    10/2001

* cited by examiner

*Primary Examiner*—David N Spector
(74) *Attorney, Agent, or Firm*—Fish & Richardson P.C.

(57) ABSTRACT

A catadioptric projection objective has, along an optical axis, a concave mirror; a positive lens group with positive refractive power arranged adjacent to the concave mirror and spaced apart therefrom; a first prism and a second prism each having respective first flat surfaces and second flat surfaces, wherein the second flat surfaces are arranged adjacent to the positive lens group and on opposite sides of the optical axis, and wherein the first flat surfaces are arranged adjacent to an object plane and an image plane, respectively, of the projection objective. The projection objective has unit magnification and at least one focus at a wavelength in a design wavelength band that includes mercury g-, h- and i-lines. At least the thickest optical element of the positive lens group and the first and second prism are made from optical material having an absorption coefficient $k<0.001$ cm$^{-1}$ in the design wavelength band.

26 Claims, 4 Drawing Sheets

UNIT MAGNIFICATION PROJECTION OBJECTIVE

CROSS-REFERENCE TO RELATED APPLICATIONS

This application claims priority under 35 U.S.C. §119(e)(1) to U.S. Ser. No. 60/851,053, filed Oct. 12, 2006. This application claim priority under 35 U.S.C. §119 to European patent application serial number 06 02 1401.2, filed Oct. 12, 2006. The contents of both of these applications is hereby incorporated by reference.

FIELD

The disclosure relates to catadioptric projection objectives, such as apochromatic large-field unit-magnification catadioptric projection objectives for photolithographic applications, as well as related systems, components and methods.

BACKGROUND

Photolithography is presently employed not only in sub-micron resolution integrated circuit (IC) manufacturing, but also to an increasing degree in advanced wafer-level IC packaging as well as in semiconductor, microelectromechanical systems (MEMS), nanotechnology (i.e., forming nanoscale structures and devices), and other applications. These applications can involve multiple imaging capabilities ranging from relatively low resolution (i.e., a few microns) with large depth of focus, to relatively high resolution (i.e. sub-micron) and a high throughput.

A number of modified Wynne-Dyson systems capable of imaging a relatively large field over both a narrow and a broad spectral range in a design wavelength band including the mercury g-, h- and i-lines at about 436 nm, about 405 nm and about 365 nm, respectively, have been developed in recent years.

SUMMARY

In some embodiments, the disclosure provides a catadioptric projection objective with unit magnification which can be utilized in a broad design wavelength band including mercury g-, h- and i-lines which allows a high throughput of exposed substrates.

In certain embodiments, the disclosure provides a catadioptric projection objective with unit magnification which is easy to manufacture.

In some embodiments, the disclosure provides a unit magnification catadioptric projection objective which allows a long-term stable photolithographic manufacturing process with improved stability of optical performance and prolonged lifetime of the projection objective when compared with conventional projection objectives.

In certain embodiments, the disclosure provides a unit magnification catadioptric projection objective having a relatively stable optical performance in varying operation conditions.

In one aspect, the disclosure provides a catadioptric projection objective. The projection object includes, along its optical axis, a concave mirror, a positive lens group, a first prism and a second prism. The positive lens group has positive refractive power. The positive lens group is arranged adjacent to the concave mirror and spaced apart therefrom, and the positive lens group includes optical elements. The first and second prsimes each have first and second flat surfaces. The second flat surfaces are arranged adjacent to the positive lens group and on opposite sides of the optical axis. The first flat surface of the first prism is arranged adjacent to the object plane. The first flat surface of the second prism is arranged adjacent to the image plane. The projection objective has unit magnification and at least one focus at a wavelength in a design wavelength band that includes mercury g-, h- and i-lines. The optical elements of the positive lens group include a thickest optical element having a maximum thickness of optical elements within the positive lens group. At least the thickest optical element of the positive lens group and the first and second prisms are made from optical material having an absorption coefficient k that is less than 0.001 cm$^{-1}$ in the design wavelength band.

In another aspect, the disclosure provides a catadioptric projection objective. The projection objective includes, along its optical axis, a concave mirror, a positive lens group, a first prism and a second prism. The positive lens group has positive refractive power. The positive lens group is arranged adjacent to the concave mirror and spaced apart therefrom. The positive lens group includes optical elements. The first first prism has a first flat surface that is arranged adjacent to the object plane. The second prism has a first flat surface that is arranged adjacent to the image plane. The first and second prisms each have a second flat surface that is arranged adjacent to the positive lens group and on opposite sides of the optical axis. The projection objective has unit magnification and at least one focus at a wavelength in a design wavelength band that includes mercury g-, h- and i-lines. Each optical element of the positive lens group and the first and second prisms is made from a transparent material having Abbe number $v_{Hg}=(n_h-1)/(n_i-n_g)$, where $n_g$, $n_h$ and $g_i$ is the refractive index of the transparent material at the wavelength of the mercury g-, h- or i-line, respectively. Only two different materials having different Abbe numbers are utilized, with one of the materials being a relatively low dispersion first material with $v_{high}$ and the other being a relatively high dispersion second material with $v_{low}<v_{high}$, where an Abbe number difference $\Delta v=v_{high}-v_{low}$ is at least 10.

In another aspect, the disclosure provides an optical system (e.g., a microlithography optical system) that includes an illumination system and a catadioptric projection system (e.g., such as one of the catadioptric projection objectives described in the preceding two paragraphs). Optionally, the system also includes an appropriate light source.

The projection objective can be configured to allow an exposure of substrates utilizing light from a "design wavelength band". The term "design wavelength band" denotes a range of wavelengths including those wavelengths for which the optical performance of the projection objective is sufficiently good to allow diffraction limited imaging with relatively low aberration level. Where the configuration of the projection objective is such that the design wavelength band includes mercury g-, h- and i-lines, the projection objective may be used in conjunction with high power mercury-arc lamps as a light source of the projection exposure apparatus. Therefore, the optical performance is optimized for at least one of the mercury lines at about 365 nm (i-line), about 405 nm (h-line) and about 436 nm (g-line), whereas the optical performance may deteriorate significantly outside the design wavelength band. Typically, a projection objective exclusively optimized for a design wavelength band including mercury g-, h- and i-lines cannot be operated for exposure at significantly smaller wavelength, such as in the deep ultraviolet (DUV) region with wavelength smaller than about 260 nm and/or in the visible wavelength range, e.g. at wavelength larger than about 500 nm.

Using a high power mercury-arc lamp as a light source typically allows a relatively high throughput of exposed substrates if the illumination system and the projection objective have sufficient transmission.

According to one aspect of the disclosure, high transmission of the projection objective is secured by using transparent material with very low specific absorption in the design wavelength band at least for the thickest optical element within the positive lens group. As used here, the term "thickness" of an optical element refers to the thickness measured along the optical axis, i.e. an axial distance between an entrance surface and an exit surface of the optical element.

Very low specific absorption (represented by the absorption coefficient k) also contributes to avoiding or minimizing negative effects due to "lens heating" during operation of the projection objective. The heating of lenses or lens groups and other transparent optical elements during operation due to an increased absorption in the transparent material ("lens heating") is one effect dynamically influencing the imaging properties of a projection system during operation. Those effects may be particularly hard to compensate for if the local heating of irradiated transparent material is not rotationally symmetric relative to optical axis, which is typically the case in catadioptric projection objectives using an off-axis object field and image field. For example, an asymmetric heating of lenses disposed optically close to a field surface (such as the object surface or the image surface) typically introduces astigmatism on the axis, compensation of which is difficult.

In some embodiments, all optical elements constituting the positive lens group and the first and second prism are made from optical material having an absorption coefficient $k<0.001$ cm$^{-1}$ in the design wavelength band, whereby absorption can be kept low in all parts of the projection objective where transparent elements are disposed.

In some embodiments, all optical elements provided in addition to the thickest optical element and the first and second prism are made from optical material having an absorption coefficient $k<0.005$ cm$^{-1}$ in the design wavelength band, or having an absorption coefficient $k<0.004$ cm$^{-1}$ in design wavelength band.

The low-absorption optical material used for some or all transparent optical elements may be selected from calcium fluoride (CaF$_2$), fused silica (SiO$_2$), the special glasses LLF1, LF5, FK5 (names of special optical glasses manufactured by SCHOTT company, Mainz, Germany), S-FPL51, S-FSL5, S-BSL7, S-BAL15, S-BAL35, PBL6, PBL1, PBL26, PBL25, BSM51, PBM2, PBM8 (names of special optical glasses manufactured by OHARA company).

The projection objective may be designed such that there is only one common focus at or close to one of the mercury lines, e.g. around the i-line at about 365 nm. In some embodiments the projection objective has two, three or more common foci at respective two or more wavelengths in the design wavelength band. Where the projection objective is corrected for two or more wavelength, those wavelengths may be used for exposure, whereby a larger fraction of the output power of the mercury light source can be utilized for the exposure. In that case, a higher throughput may be obtained. If the projection objective is corrected only for one of the mercury lines, the radiation corresponding to the other mercury lines should be filtered out upstream of the projection objective to avoid image deterioration.

In some embodiments, the projection objective is corrected such that a mean overall wavefront error is less than 30 nm RMS (root-mean-square) for all three mercury lines (g-, h- and i-line).

Where exposure radiation from a broad design wavelength band is utilized, the correction of chromatic aberrations (color correction) becomes a major issue in the optical design. It is possible to use three and more transparent optical materials having different dispersion in the projection objective. Some embodiments allow to use only two different optical materials and still obtain sufficient color correction whereby manufacturing is largely facilitated. In some embodiments, each optical element of the positive lens group and the prisms is made from a transparent material having Abbe number $v_{Hg}=(n_h-1)/(n_i-n_g)$, where $n_g$, $n_h$ and $n_i$ is the refractive index of the transparent material at the wavelength of the mercury g-, h- or i-line, respectively, wherein only two different materials having different Abbe numbers are utilized, one of the materials being a relatively low dispersion first material with $v_{high}$ and the other being a relatively high dispersion second material with $v_{low}<v_{high}$, where an Abbe number difference $\Delta v=v_{high}-v_{low}$ is at least 10. If these conditions are observed, the Abbe number difference is large enough to obtain sufficient color correction even if only two different optical materials are utilized. Note that the definition of the Abbe number differs from conventional definitions and is adapted to the wavelength band around the mercury lines.

In general, a combination of an optical material having a relatively low dispersion and an optical material having a relatively high dispersion are used in combination to contribute to color correction. Typically, the correction becomes easier the larger the difference between the respective dispersion values is. In terms of the Abbe number, relatively low dispersion corresponds to relatively high Abbe number (so called crown glasses), whereas relatively small Abbe numbers correspond to relatively high dispersion materials (so called flint glasses). In some embodiments employing just two materials the condition $85 \geq v_{high} \geq 75$ holds for the relatively low dispersion crown glass (first material) and the condition $65 \geq v_{low} \geq 55$ holds for the relatively high dispersion flint glass (second material). For example, calcium fluoride may be used as the first material and fused silica may be utilized as the second material. In some embodiments, only calcium fluoride and fused silica are used for the transparent optical elements. Within this combination, calcium fluorite represents the crown glass, whereas fused silica represents the flint glass.

In certain embodiments, the condition $65 \geq v_{high} \geq 55$ holds for the relatively low dispersion first material and the condition $45 \geq v_{low} \geq 25$ holds for the relatively high dispersion second material. For example, the first material may be fused silica, whereas the second material may be a high dispersion special glass, such as LLF1 or LF5 (SCHOTT) or corresponding special glasses by Ohara or other manufactures.

The problems caused by lens heating can be particularly pronounced in optical elements close to field surfaces such as in the first and second prism. Large benefits can be obtained if those prisms are made from virtually absorption free material having an absorption coefficient $k<0.001$ cm$^{-1}$ in the design wavelength band. For example, both prisms may be made from fused silica or calcium fluoride.

Problems due to lens heating may also be controlled more effectively if very thick optical elements are avoided, since heat dissipation is generally improved where the lens thickness does not exceed a critical value. In some embodiments, the positive lens group includes a thickest optical element having a thickness $T_{max}<100$ mm. $T_{max}$ may be less than 98 mm, or less than 96 mm, or less than 94 mm, for example. In some embodiments, the thickest optical element is made of fused silica. The lens manufacturing with fused silica is well established, the material is available with high optical quality and is significantly less expensive than calcium fluoride. Therefore, a contribution to a simple and inexpensive construction is made.

In some embodiments the positive lens group comprises in this order from a prism side facing the prisms to a mirror side facing the concave mirror: a piano-convex positive lens having a substantially flat surface facing the prisms and a convex surface facing the mirror; a negative meniscus lens having a concave side facing the prisms and a convex side facing the mirror; a first positive lens; and a second positive lens. No further lenses are utilized in certain embodiments.

Some embodiments are arranged to obtain relatively large effective field radius and/or higher values for the image-side numerical aperture NA when compared to the conventional systems. As the resolution of a projection system generally increases with increasing NA, larger values for NA allow to obtain better resolution desirable for printing finer structures. A large effective field radius allows to utilize effective object fields and image fields with larger dimensions, whereby the field size of exposed structures may be increased and also the throughput of exposed substrates may be increased when compared to conventional systems. In some embodiments, the projection objective has an effective field radius $R_{DIF}>80$ mm and an image-side numerical aperture $NA \geq 0.3$.

Some embodiments have been arranged to obtain a relatively large size of the effective image field, while at the same time the image side numerical aperture NA has considerably large values to allow to print large size structures at relatively high resolution. For this purpose, it is desirable to optimize the size and shape of the object field which can be effectively imaged by the projection objective without vignetting at a given numerical aperture. The corresponding object field will be denoted "effective object field" in the following. The size of the effective object field and the size of the corresponding "effective image field" are related through the magnification factor of the projection objective. It may be desired to maximize the size of the effective fields and/or to optimize the shape of the effective fields in order to improve productivity of the manufacturing process involving the projection objective. A further parameter to be observed in the designing process is the size of the object field for which the projection objective is desirably sufficiently corrected with respect to image aberrations in order to obtain the desired performance. The aberrations typically include chromatic aberrations, image curvature aberrations, distortion, spherical aberrations, astigmatism etc. The object field, for which the projection objective is desirably sufficiently corrected, will be denoted "design object field" in the following, which corresponds to a respective "design image filed" in the image surface. Generally, correction becomes more difficult the larger the size of the design object field or design image field becomes. At a given image-side numerical aperture NA, a projection objective may be characterized by a specific value for the "design étendue" E, which is defined in this application as the product of the image-side numerical aperture NA and the radius $R_{DIF}$ of the design image filed. In some embodiments, the projection objective has a design image field radius $R_{DIF}$, an image-side numerical aperture NA and the condition $E=NA*R_{DIF}>24$ mm is fulfilled for the design étendue E.

The disclosure further relates to a projection exposure system comprising a light source emitting primary radiation from a wavelength band including mercury g-, h- and i-lines; an illumination system for receiving light from the light source and for forming an illumination field in an exit surface of the illumination system, and a catadioptric projection objective as described above or below.

Other features and advantages will be apparent from the description, drawings and claims.

DETAILED DESCRIPTION

In the following description, the term "optical axis" refers to a straight line or a sequence of straight-line segments through the centers of curvature of optical elements. In the exemplary embodiments, the object may be a mask (reticle) bearing a pattern of an integrated circuit or some other pattern, for example a grating pattern or another pattern structure adapted to a particular manufacturing step in advanced wafer-level IC packaging. In the examples, the image of the object is projected onto a wafer coated with a layer of a light-sensitive substance serving as a substrate. Other types of substrates, such as components of liquid-crystal displays or substrates for optical gratings, or substrates for nanotechnology are possible.

Where appropriate, identical or similar features or feature groups in different embodiments are denoted by similar reference identifications. Where reference numerals are used, those are increased by 100 or multiples of 100 between embodiments. Where tables are provided to disclose the specification of a design shown in a figure, the table or tables are designated by the same numbers as the respective figures.

Figure 1:
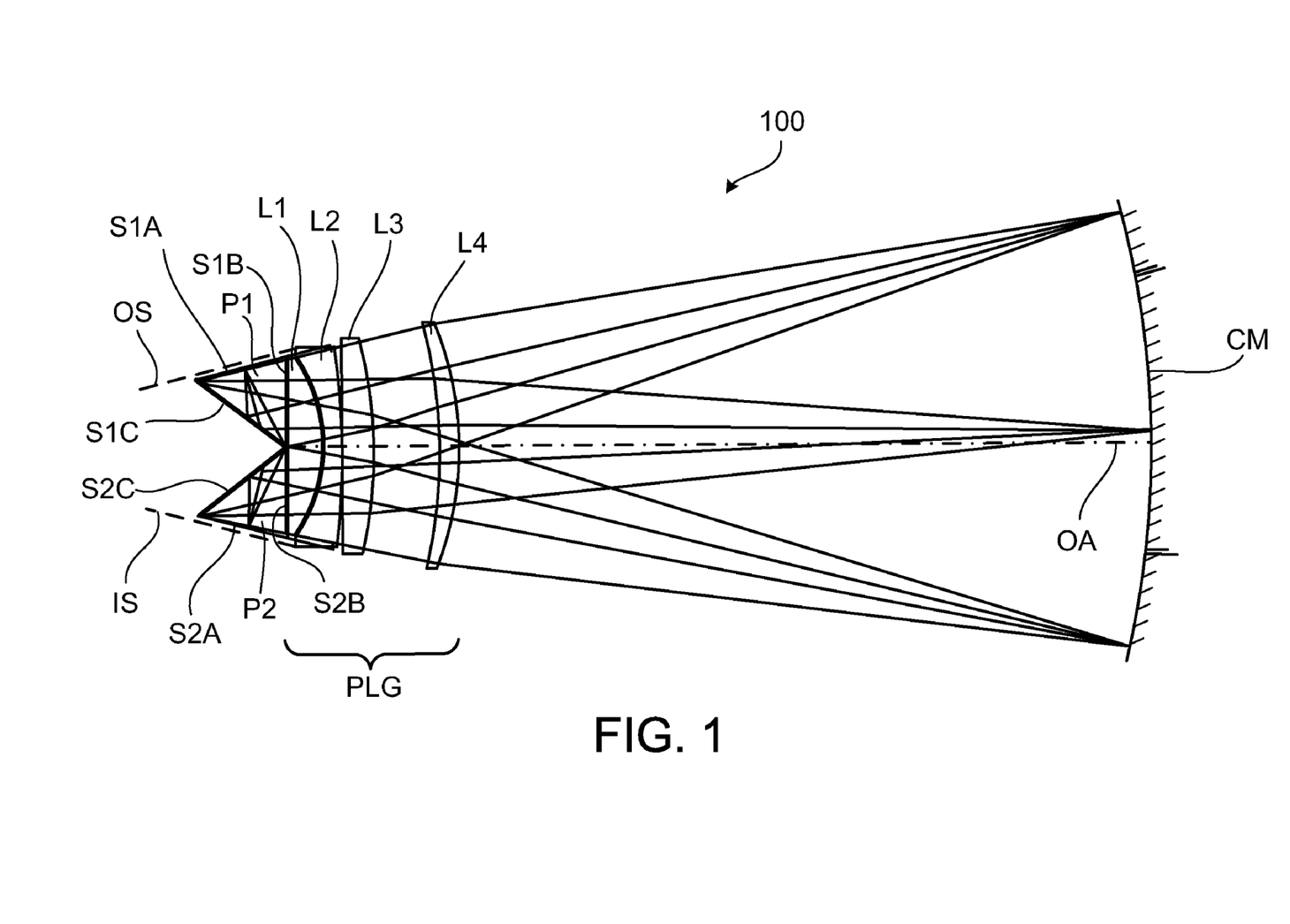
FIG. 1 shows a meridional lens section of a large-field unit-magnification catadioptric projection objective.

FIG. 1 shows a large-field unit-magnification catadioptric projection objective 100 for photolithographic applications. The projection objective is basically a modified Wynne-Dyson type optical system. Where those optical systems have all optical surfaces essentially concentric to the center of curvature of the concave mirror, coma, distortion and lateral color are well corrected. The broad band color correction needed for a diffraction-limited performance over a relatively wide design wavelength band is accomplished by proper choices of the optical materials and the power distribution of the dioptric (refractive) lens elements and the concave mirror. In addition the system has been optimized with regard to absorption-induced aberrations by selecting very low absorption material for the transparent optical elements.

The projection objective 100 is designed to project an image of a pattern on a reticle arranged in the planar object surface OS (object plane) into a planar image surface IS (image plane) at unit magnification (β=1) without forming an intermediate image. An off-axis effective object field OF positioned outside the optical axis OA is thereby projected into an off-axis effective image field IF (see also FIG. 3).

As used herein, the term "effective image field" means a field in the image surface that the photolithographic system is capable of imaging when it is used in a step-and-repeat mode of operation. The term "color corrected" is used to describe a system having a common (coincident) focus position for different wavelengths of light. Therefore, if the projection objective has at least one focus at a wavelength in a broad design wavelength band including mercury g-, h- and i-lines a high power mercury arc lamp may be used as light source for the exposure process.

The projection objective includes a single concave mirror CM having a curved mirror surface rotationally symmetric to the optical axis OA. A positive lens group PLG having overall positive refractive power is arranged adjacent to the concave mirror and spaced apart therefrom at a distance corresponding to about twice the optically free diameter of the concave mirror. A first prism P1 is arranged adjacent to the positive lens group PLG on the opposite side to concave mirror CM on one side of the optical axis facing the object surface OS. First prism P1 has a first flat surface S1A arranged adjacent to the object surface at a small distance therefrom, a second flat surface S1B at an angle to the first flat surface arranged adjacent to the positive lens group PLG and oriented essentially perpendicular to the optical axis, and a third flat surface S1C oriented at an angle to the optical axis and to the object surface for folding the optical axis. A second prism P2 is arranged adjacent to the positive lens group PLG on the opposite side to concave mirror CM on the opposite side to first prism P1 and facing the image surface IS. Second prism P2 has a first flat surface S2A arranged adjacent to the image surface at a small distance therefrom, a second flat surface S2B at an angle to the first flat surface arranged adjacent to the positive lens group PLG and oriented essentially perpendicular to the optical axis, and a third flat surface S2C oriented at an angle to the optical axis and to the image surface for folding the optical axis. Object surface OS and image surface IS are spaced apart from the respective flat surfaces S1A and S2A by respective gaps representing working distances. Although first and second prisms P1 and P2 are not included in the positive lens group, these prisms play a role in the aberration correction including chromatic aberration correction.

The positive lens group PLG consists, in this order from a prism side facing the prisms P1, P2 to a mirror side facing the concave mirror CM, a piano-convex positive lens L1 having a substantially flat surface facing the prisms P1, P2 and a convex surface facing the concave mirror, a negative meniscus lens L2 having a concave side facing the prisms and a convex side facing the concave mirror, a biconvex first positive lens L3, and a meniscus-shaped second positive lens L4. The term "substantially flat" relates to a lens surface having a large radius r of curvature, typically with r>1000 mm or r>2000 mm. Here r>4000 mm.

The projection objective 100 is designed for operation with radiation provided by a mercury arc lamp using radiation from a broad design wavelength band including the mercury g-, h- and i-lines between about 360 nm and about 440 nm (compare FIG. 2) at an image-side numerical aperture NA=0.3 in a design image field having design image field radius $R_{DIF}$=84 mm. Note that the design image field radius corresponds to the image field height y' (radius of the effective image field) where an outermost field point of the effective image field lies at the outer edge of the design object field.

The specification is summarized in table 1. The leftmost column lists the number of the refractive, reflective, or otherwise designated surface, the second column lists the radius, r, of that surface [mm], the third column lists the distance, d [mm], between that surface and the next surface, a parameter that is referred to as the "thickness" of the optical surface, the fourth column lists the material employed for fabricating that optical element, and the fifth column lists the refractive index of that material. The sixth column lists the optically utilizable, clear, semi diameter [mm] of the optical component. A radius r=0 in a table designates a planar surface (having infinite radius).

A number of surfaces in table 1 are aspherical surfaces. Table 1A lists the associated data for those aspherical surfaces, from which the sagitta or rising height p(h) of their surface figures as a function of the height h may be computed employing the following equation:

$$p(h)=[((1/r)h^2)/(1+SQRT(1-(1+K)(1/r)^2 h^2))]+C1 \cdot h^4 + C2 \cdot h^6 + \ldots,$$

where the reciprocal value (1/r) of the radius is the curvature of the surface in question at the surface vertex and h is the distance of a point thereon from the optical axis. The sagitta or rising height p(h) thus represents the distance of that point from the vertex of the surface in question, measured along the z-direction, i.e., along the optical axis. The constants K, C1, C2, etc., are listed in Table 1A.

Only two optical materials, each having very low absorption in the design wavelength band, are used for the transparent optical elements. The first and second prisms P1, P2, the almost piano-convex positive lens L1 directly adjacent to the prisms, and biconvex positive lens L3 between lenses L2 and L4 are made from fused silica. Negative meniscus lens L2 and positive meniscus lens L4 are made from a special i-line glass provided by Schott, Mainz, denoted as "LLF1". In this combination of optical materials, fused silica is effective as the relatively low dispersion crown glass, whereas LLF1 is effective as a relatively high dispersion flint glass.

Table 2 reproduced below summarizes relevant optical data for representative optical materials which may be utilized in the context of some embodiments. In the table, the parameters $n_g$, $n_h$ and $n_i$ refer to the refractive index of the transparent material at the wavelength of the mercury g-, h- or i-line, respectively, whereas the parameters $k_g$, $k_h$ und $k_i$ refer to the corresponding absorption coefficients. As seen from table 2, each of the two materials used has a very low absorption with $k<0.005 \text{ cm}^{-1}$ for each of the mercury lines, where the highest absorption occurs in LLF1 for the i-line and no significant absorption occurs in the fused silica.

TABLE 2

| Mat | $n_g$ 436 nm | $n_h$ 405 nm | $n_i$ 365 nm | Abbe Number | k (g-line), $k_g$ [1/cm] | k h-line, $k_h$ [1/cm] | k i-line, $k_i$ [1/cm] |
|---|---|---|---|---|---|---|---|
| CaF2 | 1.4395 | 1.4415 | 1.4449 | 81.384 | <0.001 | <0.001 | <0.001 |
| Quarz | 1.4667 | 1.4696 | 1.4746 | 59.992 | <0.001 | <0.001 | <0.001 |
| LLF1 | 1.5633 | 1.5691 | 1.5793 | 35.5984 | 0.0014 | 0.0016 | 0.0033 |
| LF5 | 1.5996 | 1.6067 | 1.6193 | 30.9338 | 0.0010 | 0.0014 | 0.0082 |
| FK5 | 1.4959 | 1.4989 | 1.504 | 61.796 | 0.0012 | 0.0010 | 0.0014 |

In the catalogs of glass suppliers, optical materials are frequently characterized with their transmission coefficients. For example, in the SCHOTT catalog "Schott optisches Glas" the parameter "Reintransmissionsgrad $\tau_i$" (purity degree of transmission) is found. Values are given for several wavelengths and for a thickness T of 5 mm or 25 mm. To calculate the corresponding absorption coefficient the following formula may be used:

$$k = -\frac{lg\tau_i}{T}$$

Figure 2:
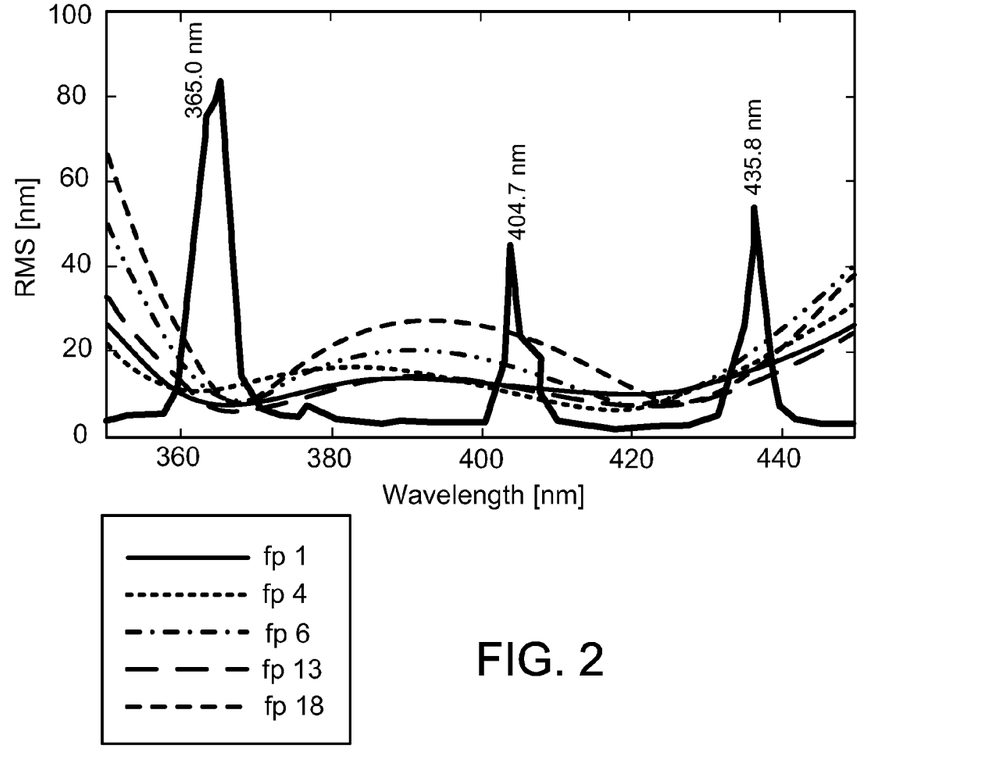
FIG. 2 shows a diagram of an emission spectrum of a mercury arc lamp used as a light source in a projection exposure apparatus.

The system provides a good simultaneous correction for a design wavelength band between about 365 nm and about 436 nm. The correction state is given in more detail in FIG. 2 showing a diagram of the wavefront aberrations (RMS) between 350 nm and 450 nm for five selected field points fp1, fp4, fp6, fp13 and fp18 as shown as dots in FIG. 3. The bold line represents the emission intensity of the mercury arc lamp light source with local intensity maxima at 365.0 nm (i-line), 404.7 nm (h-line) and 435.8 nm (g-line). It is evident that the wavefront aberration is significantly smaller than about 30 nm for each of the mercury lines. For most field points the correction is significantly smaller than that, for example less than 20 nm at the g-line. Due to the broad band correction in the mercury wavelength band, all three intensity maxima can be used in the exposure, thereby allowing exposure with high overall intensity, thereby allowing increased throughput. Also, in the field of wafer-level packaging, it is to be noted that coarse structures requiring only medium resolution are typically manufactured using relatively thick resist layers. Relatively large light intensities can be used in that case. Therefore, an optical system having three common foci at the mercury g-, h- and i-lines may be particularly useful in the production of relatively coarse structures in wafer-level packaging. Typically finer structures are exposed using relatively thinner resist layers. In these cases relatively smaller power is necessary for the exposure. Therefore, in those cases it may be sufficient to use a projection objective corrected only for one of the mercury lines, e.g. the i-line.

Correction is supported by only two relatively weak aspherical surfaces, namely the prism-side surface of positive meniscus lens L4, and the concave mirror surface. A small number of relatively weak aspherics facilitates manufacturing.

When a broad spectral band is intended to be covered then some aberrations is desirably corrected that do not have to be considered when only a single lamp line is being used. With a broad design wavelength band it is important that chromatic variation of astigmatism and Petzval curvature be corrected. This can involve (at least) two glass types with different dispersions. If the design is nearly concentric, then correcting chromatic variation of astigmatism automatically also corrects the chromatic variation in Petzval curvature. But in a design that is far from having concentric surfaces, these two aberrations are quite different and are not linked together.

To get good correction at two widely separated wavelength (i.e. in a broad wavelength band) can involve at a minimum, correction for chromatic variation in spherical aberration, astigmatism, and Petzval curvature. In FIG. 1, this correction is performed using just two optical materials, namely fused silica and LLF1 glass.

The design works very good with an aspheric surface in the positive lens group PLG and also an aspheric surface on the concave mirror, but a modification without a mirror aspheric (i.e. with a spherical mirror) still has reasonable good performance. The design is very relaxed when compared to prior art modifications of Wynne-Dyson-Systems. A relaxed system in that sense can cover large field sizes without running into extreme incidence angle problems, i.e. into problems caused by very large angles of incidence at optical surfaces.

There are only four lenses in addition to the prisms and the concave mirror. All lenses are relatively thin (maximum thickness $T_{max}$<43 mm for L1). A relaxed structure with relatively large values for the shortest radius of a curved surface (about 188 mm) is given. The first three lenses L1, L2 and L3 following the folding prism P1 are airspaced in the embodiment. Any two of theses three lenses may be cemented together without much change in performance. If a different glass than LLF1 were used together with fused silica, then all three lenses may be cemented together without much change in performance, if that is desired. Optical performance may be improved further if a more dispersive glass, such as LF5 is, is paired with fused silica instead of LLF1. Possible improvement of optical performance by this replacement can involve a theoretical trade off with respect to sensitivity to lens heating, as LF5 has slightly larger absorption when compared to LLF1 (see table 2). Therefore, the design has potential to be optimized in different directions including the optical performance and the sensitivity to absorption-induced problems.

The projection objective is capable of projecting a relatively large effective image field when compared to conventional systems. This is further explained in connection with FIG. 3, which shows a schematic diagram of the image field side of the projection objective. The hatched rectangular area represents the effective image field IF utilized in the exposure process. The effective image field is disposed entirely outside the optical axis OA and is offset thereto by an offset OY in the y direction. The effective image field has a length A in the y direction and a width B in the x direction perpendicular thereto. The effective image field is positioned with respect to the optical axis OA such that all field points within the effective image field are imaged at a given numerical aperture without vignetting.

Figure 3:
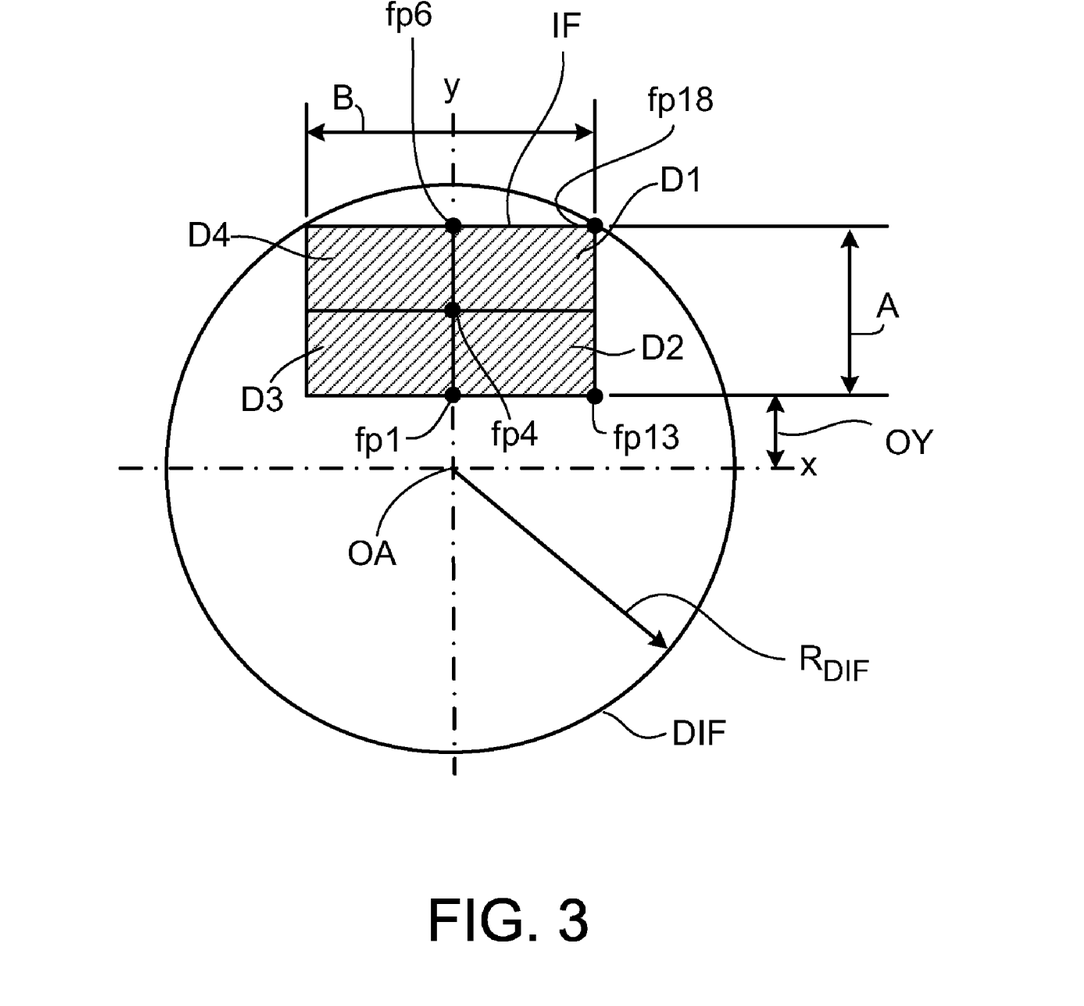
FIG. 3 shows a schematic drawing of a design image field and a rectangular effective image field within the design image field disposed outside the optical axis (off-axis image field)

The design image field DIF is a circular area of minimum radius $R_{DIF}$ concentric with the optical axis OA enclosing the effective image field IF. The design image field includes all field points of the image surface which can be projected by the projection objective with an imaging fidelity sufficient for the intended lithographic process. With other words: within zones having radial coordinates smaller than $R_{DIF}$ all imaging aberrations are corrected sufficiently for the intended projection purpose, whereas at least one of the aberrations is higher than a desired threshold value for field points outside the design image field.

A minimum distance in the y-direction between the inner edge of the effective image field IF and the optical axis is needed to avoid vignetting, therefore the edge offset OY may not be smaller than a threshold value given by the optical design. OY=25 mm. Under theses conditions it is evident that the dimensions of the effective image field may be larger the larger the design image field radius $R_{DIF}$ is. However, for a desired NA, any increase of the radius $R_{DIF}$ of the design object field can involve increasingly harder efforts to obtain correction. The design field radius $R_{DIF}$ (corresponding to the maximum image height y') is 84 mm, which is significantly larger than the respective value for conventional systems with comparable NA.

The large design field radius of 84 mm allows an orthogonal field with dimensions B=66 mm and A=52 mm to fit inside. As indicated in FIG. 3 this allows to expose four standard dies D1, D2, D3 and D4 each having 26 mm*33 mm dimensions to be exposed in one exposure step. Of course, effective image fields having other dimensions, for example smaller in the y-direction and wider in the x-direction, may be used.

Figure 4:
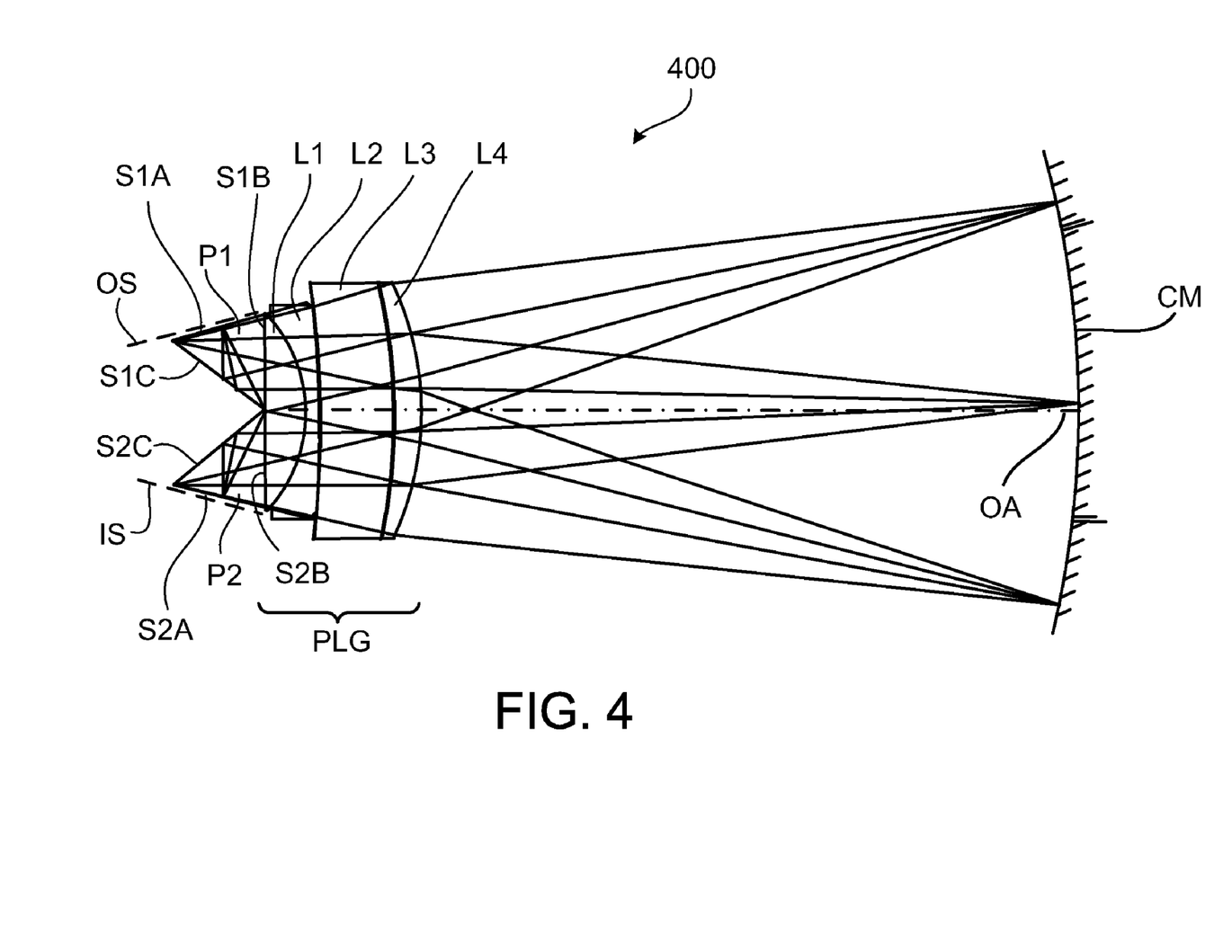
FIG. 4 shows a meridional lens section of large-field unit-magnification catadioptric projection objective.

FIG. 4 shows a projection objective 400 which is a modification of the design shown in FIG. 1. Reference is made to the respective description of the basic construction and the sequence and types of optical elements. The specification is given in tables 4, 4A. NA=0.3. A large design field radius of 84 mm allows an orthogonal field with dimensions B=66 mm and A=52 mm to fit inside.

The thickest optical element of the positive lens group is formed by the positive meniscus lens L3 made from fused silica, the thickness is 92 mm. Only two low absorption materials are used (fused silica and LLF1). Correction is supported by only three relatively weak aspherical surfaces, namely the prism-side surfaces of piano-convex lens L1 and positive meniscus lens L4, and the concave mirror surface. In a modification, only two aspherics are used.

Other embodiments are in the claims.

TABLE 1

NA = 0.3; y' ($R_{DIF}$) = 84 mm

| SURF | RADIUS | THICKNESS | MATERIAL | INDEX | SEMIDIAM. |
|---|---|---|---|---|---|
| 0 | 0.000000 | 5.000000 | | | 84.0 |
| 1 | 0.000000 | 105.000000 | SILUV | 1.474549 | 85.6 |
| 2 | 0.000000 | 0.000000 | REFL | 1.474549 | 107.0 |
| 3 | 0.000000 | −3.000000 | | | 108.0 |
| 4 | 4996.252949 | −43.000000 | SILUV | 1.474549 | 115.0 |
| 5 | 187.793100 | −2.147347 | | | 115.0 |
| 6 | 189.044644 | −20.000000 | LLF1 | 1.579317 | 115.0 |
| 7 | 1415.238769 | −1.999923 | | | 125.0 |
| 8 | 51676.575519 | −38.119908 | SILUV | 1.474549 | 137.0 |
| 9 | 617.589297 | −84.290087 | | | 137.0 |
| 10 | 730.927774 | −25.000000 | LLF1 | 1.579317 | 155.0 |
| 11 | 430.513554 | −874.689538 | | | 155.0 |
| 12 | 1200.000000 | 874.689538 | REFL | | 285.4 |
| 13 | 430.513554 | 25.000000 | LLF1 | 1.579317 | 155.0 |
| 14 | 730.927774 | 84.290087 | | | 155.0 |
| 15 | 617.589297 | 38.119908 | SILUV | 1.474549 | 137.0 |
| 16 | 51676.575519 | 1.999923 | | | 137.0 |
| 17 | 1415.238769 | 20.000000 | LLF1 | 1.579317 | 125.0 |
| 18 | 189.044644 | 2.147347 | | | 115.0 |
| 19 | 187.793100 | 43.000000 | SILUV | 1.474549 | 115.0 |
| 20 | 4996.252949 | 3.000000 | | | 115.0 |
| 21 | 0.000000 | 0.000000 | SILUV | 1.474549 | 107.0 |
| 22 | 0.000000 | −105.000000 | REFL | 1.474549 | 107.9 |
| 23 | 0.000000 | −5.000000 | | | 85.6 |
| 24 | 0.000000 | 0.000000 | | | 84.0 |

TABLE 1A

ASPHERIC CONSTANTS

| SRF | 10 | 12 | 14 |
|---|---|---|---|
| K | 0 | 0 | 0 |
| C1 | 9.746756E−10 | −8.668474E−13 | 9.746756E−10 |
| C2 | 3.362908E−15 | −1.456776E−18 | 3.362908E−15 |
| C3 | −6.164282E−22 | 9.060585E−24 | −6.164282E−22 |
| C4 | 2.422082E−25 | −5.503633E−29 | 2.422082E−25 |

TABLE 4

NA = 0.3; y' ($R_{DIE}$) = 84 mm

| SURF | RADIUS | THICKNESS | MATERIAL | INDEX | SEMIDIAM. |
|---|---|---|---|---|---|
| 0 | 0.000000 | 5.000000 | | | 84.0 |
| 1 | 0.000000 | 105.000000 | SILUV | 1.474549 | 39.4 |
| 2 | 0.000000 | 0.000000 | REFL | 1.474549 | 108.0 |
| 3 | 0.000000 | -2.000000 | | | 107.0 |
| 4 | -6797.721962 | -50.000000 | SILUV | 1.474549 | 115.0 |
| 5 | 169.428038 | -1.968259 | | | 115.0 |
| 6 | 168.972420 | -15.000000 | LLF1 | 1.579317 | 115.0 |
| 7 | 1278.122337 | -3.000000 | | | 125.0 |
| 8 | 1096.676595 | -92.901798 | SILUV | 1.474549 | 150.0 |
| 9 | 536.194939 | -1.000000 | | | 150.0 |
| 10 | 579.798436 | -32.000000 | LLF1 | 1.579317 | 150.0 |
| 11 | 320.804933 | -826.294742 | | | 150.0 |
| 12 | 1136.089329 | 826.294742 | REFL | | 250.9 |
| 13 | 320.804933 | 32.000000 | LLF1 | 1.579317 | 150.0 |
| 14 | 579.798436 | 1.000000 | | | 150.0 |
| 15 | 536.194939 | 92.901798 | SILUV | 1.474549 | 150.0 |
| 16 | 1096.676595 | 3.000000 | | | 150.0 |
| 17 | 1278.122337 | 15.000000 | LLF1 | 1.579317 | 125.0 |
| 18 | 168.972420 | 1.968259 | | | 115.0 |
| 19 | 169.428038 | 50.000000 | SILUV | 1.474549 | 115.0 |
| 20 | -6797.721962 | 2.000000 | | | 115.0 |
| 21 | 0.000000 | 0.000000 | SILUV | 1.474549 | 107.0 |
| 22 | 0.000000 | -105.000000 | REFL | 1.474549 | 107.8 |
| 23 | 0.000000 | -5.000000 | | | 85.6 |
| 24 | 0.000000 | 0.000000 | | | 84.0 |

TABLE 4A

ASPHERIC CONSTANTS

| SRF | 4 | 10 | 12 | 14 | 20 |
|---|---|---|---|---|---|
| K | 0 | 0 | 0 | 0 | 0 |
| C1 | 2.874677E-09 | -3.336369E-10 | -1.658104E-12 | -3.3364E-10 | 2.8747E-09 |
| C2 | -4.804424E-14 | -3.447554E-15 | 4.330267E-19 | -3.4476E-15 | -4.8044E-14 |
| C3 | -2.049915E-19 | 3.591323E-20 | -5.200961E-23 | 3.5913E-20 | -2.0499E-19 |
| C4 | -4.219025E-23 | 1.087016E-24 | 3.529765E-28 | 1.087E-24 | -4.219E-23 |

What is claimed is:

1. A projection objective having an object plane, an image plane and an optical axis, the projection objective comprising:
 a concave mirror along the optical axis;
 a positive lens group along the optical axis, the positive lens group having positive refractive power, the positive lens group being arranged adjacent to the concave mirror and spaced apart therefrom, the positive lens group comprising optical elements;
 a first prism along the optical axis; and
 a second prism along the optical axis,
 wherein:
  the first and second prisms each have first and second flat surfaces;
  the second flat surfaces are arranged adjacent to the positive lens group and on opposite sides of the optical axis;
  the first flat surface of the first prism is arranged adjacent to the object plane;
  the first flat surface of the second prism is arranged adjacent to the image plane;
  the projection objective has unit magnification and at least one focus at a wavelength in a design wavelength band that includes mercury g-, h- and i-lines;
  the optical elements of the positive lens group include a thickest optical element having a maximum thickness of optical elements within the positive lens group;
  at least the thickest optical element of the positive lens group and the first and second prisms are made from optical material having an absorption coefficient k<0.001 cm$^{-1}$ in the design wavelength band;
  the projection objective is a catadioptric projection; and
  the projection objective has three or more common foci at respective three or more wavelengths in the wavelength band.

2. The projection objective according to claim 1, wherein all the optical elements of the positive lens group and the first and second prism are made from optical material having an absorption coefficient k<0.001 cm$^{-1}$ in the design wavelength band.

3. The projection objective according to claim 1, wherein all optical elements provided in addition to the thickest optical element and the first and second prism are made from optical material having an absorption coefficient k<0.005 cm$^{-1}$ in the design wavelength band.

4. The projection objective according to claim 1, wherein the projection objective has two or more common foci at respective two or more wavelengths in the design wavelength band.

5. The projection objective according to claim 1, wherein the first prism and the second prism are made of fused silica.

6. The projection objective according to claim 1, wherein the first prism and the second prism are made of calcium fluoride ($CaF_2$).

7. The projection objective according to claim 1, wherein the projection objective has a design image field radius $R_{DIF} > 80$ mm and an image-side numerical aperture $NA \geq 0.3$.

8. The projection objective according to claim 1, wherein the positive lens group includes a thickest optical element having a thickness $T_{max} < 100$ mm.

9. The projection objective according to claim 8, wherein the thickest optical element is made of fused silica.

10. A projection exposure system comprising:
   a light source emitting primary radiation from a wavelength band including mercury g-, h- and i-lines;
   an illumination system configured to receive light from the light source and to form an illumination field in an exit surface of the illumination system, and
   a catadioptric projection objective according to claim 1.

11. A projection objective having an optical axis, an image plane and an object plane, the projection objective comprising:
   a concave mirror along the optical axis;
   a positive lens group along the optical axis, the positive lens group having positive refractive power, the positive lens group being arranged adjacent to the concave mirror and spaced apart therefrom, the positive lens group comprises optical elements;
   a first prism along the optical axis; and
   a second prism along the optical axis,
   wherein:
      the first prism has a first flat surface adjacent to the object plane;
      the second prism has a first flat surface adjacent to the image plane;
      the first and second prisms each have a second flat surface adjacent to the positive lens group and on opposite sides of the optical axis;
      the projection objective has unit magnification and at least one focus at a wavelength in a design wavelength band that includes mercury g-, h- and i-lines;
      each optical element of the positive lens group and the prisms is made from a transparent material having Abbe number $v_{Hg} = (n_h - 1)/(n_i - n_g)$, where $n_g$, $n_h$ and $g_i$ is the refractive index of the transparent material at the wavelength of the mercury g-, h- or I-line, respectively;
      only two different materials having different Abbe numbers are utilized, one of the materials being a relatively low dispersion first material with $v_{low} < v_{high}$ and the other being a relatively high dispersion second material with $v_{low} < v_{high}$, where an Abbe number difference $\Delta v = v_{high} - v_{low}$ is at least 10.

12. The projection objective according to claim 11, wherein the condition $85 \geq v_{high} \geq 75$ holds for the first material and the condition $65 \geq v_{low} \geq 55$ holds for the second material.

13. The projection objective according to claim 12, wherein the first material is calcium fluoride ($CaF_2$).

14. The projection objective according to claim 12, wherein the second material is fused silica.

15. The projection objective according to claim 11, wherein the condition $65 \geq v_{high} \geq 55$ holds for the first material and the condition $45 \geq v_{low} \geq 25$ holds for the second material.

16. The projection objective according to claim 15, wherein the first material is fused silica.

17. The projection objective according to claim 15, wherein the second material is LLF1.

18. A projection objective having an object plane, an image plane and an optical axis, the projection objective comprising:
   a concave mirror along the optical axis;
   a positive lens group along the optical axis, the positive lens group having positive refractive power, the positive lens group being arranged adjacent to the concave mirror and spaced apart therefrom, the positive lens group comprising optical elements;
   a first prism along the optical axis; and
   a second prism along the optical axis,
   wherein:
      the first and second prisms each have first and second flat surfaces;
      the second flat surfaces are arranged adjacent to the positive lens group and on opposite sides of the optical axis;
      the first flat surface of the first prism is arranged adjacent to the object plane;
      the first flat surface of the second prism is arranged adjacent to the image plane;
      the projection objective has unit magnification and at least one focus at a wavelength in a design wavelength band that includes mercury g-, h- and i-lines;
      the optical elements of the positive lens group include a thickest optical element having a maximum thickness of optical elements within the positive lens group;
      at least the thickest optical element of the positive lens group and the first and second prisms are made from optical material having an absorption coefficient $k < 0.001$ cm$^{-1}$ in the design wavelength band;
      the projection objective is a catadioptric projection objective;
      each optical element of the positive lens group and the first and second prisms is made from a transparent material having Abbe number $v_{Hg} = (n_h - 1)/(n_i - n_g)$, where $n_g$, $n_h$ and $g_i$ is the refractive index of the transparent material at the wavelength of the mercury g-, h- or I-line, respectively; and
      only two different materials having different Abbe numbers are utilized, one of the materials being a relatively low dispersion first material with $v_{high}$ and the other being a relatively high dispersion second material with $v_{low} < v_{high}$, where an Abbe number difference $\Delta v = v_{high} - v_{low}$ is at least 10.

19. The projection objective according to claim 18, wherein the condition $85 \geq v_{high} \geq 75$ holds for the first material and the condition $65 \geq v_{low} \geq 55$ holds for the second material.

20. The projection objective according to claim 18, wherein the first material is calcium fluoride ($CaF_2$).

21. The projection objective according to claim 18, wherein the second material is fused silica.

22. The projection objective according to claim 18, wherein the condition $65 \geq v_{high} \geq 55$ holds for the first material and the condition $45 \geq v_{low} \geq 25$ holds for the second material.

23. The projection objective according to claim 22, wherein the first material is fused silica.

24. The projection objective according to claim 22, wherein the second material is LLF1.

25. A projection objective having an object plane, an image plane and an optical axis, the projection objective comprising:
- a concave mirror along the optical axis;
- a positive lens group along the optical axis, the positive lens group having positive refractive power, the positive lens group being arranged adjacent to the concave mirror and spaced apart therefrom, the positive lens group comprising optical elements;
- a first prism along the optical axis; and
- a second prism along the optical axis, wherein:
- the first and second prisms each have first and second flat surfaces;
- the second flat surfaces are arranged adjacent to the positive lens group and on opposite sides of the optical axis;
- the first flat surface of the first prism is arranged adjacent to the object plane;
- the first flat surface of the second prism is arranged adjacent to the image plane;
- the projection objective has unit magnification and at least one focus at a wavelength in a design wavelength band that includes mercury g-, h- and i-lines;
- the optical elements of the positive lens group include a thickest optical element having a maximum thickness of optical elements within the positive lens group;
- at least the thickest optical element of the positive lens group and the first and second prisms are made from optical material having an absorption coefficient $k<0.001$ cm$^{-1}$ in the design wavelength band;
- the projection objective is a catadioptric projection objective; and
- the projection objective has a design image field radius $R_{DIF}$, an image-side numerical aperture NA and the condition $E=NA*R_F>24$ mm is fulfilled for the design étendue E.

26. A projection objective having an object plane, an image plane and an optical axis, the projection objective comprising:
- a concave mirror along the optical axis;
- a positive lens group along the optical axis, the positive lens group having positive refractive power, the positive lens group being arranged adjacent to the concave mirror and spaced apart therefrom, the positive lens group comprising optical elements;
- a first prism along the optical axis; and
- a second prism along the optical axis, wherein:
- the first and second prisms each have first and second flat surfaces;
- the second flat surfaces are arranged adjacent to the positive lens group and on opposite sides of the optical axis;
- the first flat surface of the first prism is arranged adjacent to the object plane;
- the first flat surface of the second prism is arranged adjacent to the image plane;
- the projection objective has unit magnification and at least one focus at a wavelength in a design wavelength band that includes mercury g-, h- and i-lines;
- the optical elements of the positive lens group include a thickest optical element having a maximum thickness of optical elements within the positive lens group;
- at least the thickest optical element of the positive lens group and the first and second prisms are made from optical material having an absorption coefficient $k<0.001$ cm$^{-1}$ in the design wavelength band;
- the projection objective is a catadioptric projection objective; and
- the positive lens group comprises in this order from a prism side facing the prisms to a mirror side facing the concave mirror:
  - a plano-convex positive lens having a flat surface facing the prisms and a convex surface facing the mirror;
  - a negative meniscus lens having a concave side facing the prisms and a convex side facing the mirror;
  - a first positive lens; and
  - a second positive lens.

* * * * *

UNITED STATES PATENT AND TRADEMARK OFFICE
CERTIFICATE OF CORRECTION

PATENT NO.         : 7,573,655 B2                                    Page 1 of 1
APPLICATION NO. : 11/870025
DATED              : August 11, 2009
INVENTOR(S)        : David Shafer It is certified that error appears in the above-identified patent and that said Letters Patent is hereby corrected as shown below:

On the Title pg, Item (57) Abstract, Line 5, delete "fiat" insert --flat--.

Column 1, Line 67, delete "prsimes" insert --prisms--.

Column 2, Line 22, before "prism" delete --first-- .

Column 2, Line 32, delete "$g_i$" insert --$n_i$--.

Column 9, Line 2 (Table 2), delete "CaF2" insert --$CaF_2$--.

Column 14, Line 48, Claim 1, before "; and" insert --objective--.

Column 15, Line 44, Claim 11, delete "$g_i$" insert --$n_i$--.

Column 15, Line 46, Claim 11, delete "I-line," insert --i-line,--.

Column 15, Line 50, Claim 11, delete "$V_{low}<V_{high}$" insert --$V_{high}$--.

Column 16, Line 42, Claim 18, delete "$g_i$" insert --$n_i$--.

Column 16, Line 44, Claim 18, delete "I-line," insert --i-line,--.

Signed and Sealed this

Twenty-fourth Day of November, 2009

David J. Kappos
*Director of the United States Patent and Trademark Office*